United States Patent
Grote et al.

(10) Patent No.: US 10,418,483 B2
(45) Date of Patent: Sep. 17, 2019

(54) LATERALLY DIFFUSED METAL OXIDE SEMICONDUCTING DEVICES WITH LIGHTLY-DOPED ISOLATION LAYERS

(71) Applicant: NXP B.V., Eindhoven (NL)

(72) Inventors: Bernhard Grote, Phoenix, AZ (US); Xin Lin, Phoenix, AZ (US); Saumitra Raj Mehrotra, Scottsdale, AZ (US); Ljubo Radic, Gilbert, AZ (US); Ronghua Zhu, Chandler, AZ (US)

(73) Assignee: NXP B.V., Eindhoven (NL)

( * ) Notice: Subject to any disclaimer, the term of this patent is extended or adjusted under 35 U.S.C. 154(b) by 33 days.

(21) Appl. No.: 15/797,450

(22) Filed: Oct. 30, 2017

(65) Prior Publication Data
US 2018/0151723 A1 May 31, 2018

Related U.S. Application Data

(60) Provisional application No. 62/427,291, filed on Nov. 29, 2016.

(51) Int. Cl.
*H01L 21/761* (2006.01)
*H01L 29/06* (2006.01)
(Continued)

(52) U.S. Cl.
CPC .... *H01L 29/7823* (2013.01); *H01L 21/26513* (2013.01); *H01L 21/761* (2013.01); *H01L 29/063* (2013.01); *H01L 29/0634* (2013.01); *H01L 29/0646* (2013.01); *H01L 29/0696* (2013.01); *H01L 29/1083* (2013.01); *H01L 29/36* (2013.01); *H01L 29/66681* (2013.01);
(Continued)

(58) Field of Classification Search
CPC .......... H01L 29/1083; H01L 29/66681; H01L 21/761; H01L 29/0634; H01L 29/0646; H01L 29/063
See application file for complete search history.

(56) References Cited

U.S. PATENT DOCUMENTS 6,475,870 B1  11/2002  Huang et al.
6,693,339 B1  2/2004  Khemka et al.
(Continued)

OTHER PUBLICATIONS

H. Yang, J. Zuo, Z. Zhang, W. Min, X. Lin, X. Cheng, M. Ger, and P. Rodriquez, "Approach to the silicon limit: Advanced NLDMOS in 0.13□m SOI technology for automotive and industrial applications up to 110V," in Proc. IEEE ISPSD, 2013, pp. 357-360.
(Continued)

*Primary Examiner* — Nduka E Ojeh

(57) ABSTRACT

An example laterally diffused metal oxide semiconducting (LDMOS) device includes a semiconductor substrate of a first conductivity type, active MOS regions, and a lightly-doped isolation layer (LDIL) of a second conductivity type. The active MOS regions include source and drain regions and a plurality of PN junctions. The LDIL is formed above and laterally along the semiconductor substrate, and located between the semiconductor substrate and at least a part of the active MOS regions. The LDIL is doped with dopant of the second conductivity type to cause, in response to selected voltages applied to the LDMOS device, the plurality of PN junctions to deplete each other and to support a voltage drop between the source and drain regions along the LDIL.

19 Claims, 12 Drawing Sheets

(51) Int. Cl.
   *H01L 29/66*   (2006.01)
   *H01L 29/10*   (2006.01)
   *H01L 29/78*   (2006.01)
   *H01L 21/265*  (2006.01)
   *H01L 29/36*   (2006.01)
   *H01L 29/08*       (2006.01)
   *H01L 29/49*       (2006.01)
   *H01L 29/40*       (2006.01)

(52) U.S. Cl.
   CPC ...... *H01L 29/7835* (2013.01); *H01L 29/0653* (2013.01); *H01L 29/0869* (2013.01); *H01L 29/0886* (2013.01); *H01L 29/402* (2013.01); *H01L 29/4916* (2013.01)

(56) References Cited

U.S. PATENT DOCUMENTS

| | | | | |
|---|---|---|---|---|
| 2013/0270606 A1* | 10/2013 | Chen | ................... | H01L 29/7835 257/183 |
| 2013/0341717 A1* | 12/2013 | Chen | ................ | H01L 29/66659 257/337 |
| 2015/0270333 A1* | 9/2015 | Yang | ..................... | H01L 29/063 257/337 |
| 2017/0077296 A1* | 3/2017 | Yang | ................ | H01L 29/66659 |
| 2017/0179279 A1* | 6/2017 | Lin | ................... | H01L 29/66681 |

OTHER PUBLICATIONS

H. Yang, W. Min, X. Lin, V. Newenhouse, J. Huber, H. Xu, Z. Zhang, B. Peterson, and J. Zuo, "Low-leakage SmartMOS 10W technology at 0.13□m node with optimized analog, power and logic devices for SOC design," in Proc. VLSI technology, System and Application, 2008, pp. 111-114.

M. N. Chil, O. S. Yang, D. Ke, D. J. Mo, L. Kun, M. Tiong, R. V. Purakh, and R. Nair, "Advanced 300mm 130nm BCD technology from 5V to 85V with Deep-Trench Isolation," in Proc. 2016 International Symposium on Power Semiconductor Devices and ICs, pp. 403-406.

H. Cha, K. Lee, J. Lee, and T. Lee, "0.18□m 100V-rated BCD with Large Area Power LDMOS with ultra-low effective Specific Resistance," in Proc. 2016 International Symposium on Power Semiconductor Devices and ICs, pp. 423-426.

V. Parthasarathy, V. Khemka, R. Zhu, J. Whitfield, R. Ida, A. Bose "A Double RESURF LDMOS with Drain Profile Engineering for Improved ESD Robustness" IEEE Electron Device Letters vol. 23, No. 4, p. 212 (2002).

* cited by examiner

LATERALLY DIFFUSED METAL OXIDE SEMICONDUCTING DEVICES WITH LIGHTLY-DOPED ISOLATION LAYERS

Aspects of various embodiments are directed to laterally diffused metal oxide semiconducting (LDMOS) devices and methods of forming LDMOS devices having lightly-doped isolation layers.

Various automotive, industrial, and consumer applications have had increasing demands on Smart Power technologies which integrate digital, analog, and high-voltage power transistors in one chip. Integrating such different features into one chip can involve integrations of high voltage devices with high side capability onto an advanced CMOS platform.

These and other matters have presented challenges to LDMOS devices, and related cost efficient implementations, for a variety of applications.

SUMMARY

Various example embodiments are directed to issues such as those addressed above and/or others which may become apparent from the following disclosure concerning LDMOS devices and methods of forming the same.

To provide high-side capability in a bulk Smart Power or BCD technology, typically an isolation layer is introduced that enables operation of the device enclosed above the isolation layer to float to a high potential with respect to the underlying substrate. This layer may be a buried layer with subsequent epitaxial growth of silicon, or can be implanted from the surface. It can be typically useful for this isolation layer to have a high doping concentration to reduce parasitic bipolar junction transistor (BJT) gain, and correspondingly high punch-through voltage. Moreover, low resistivity along the isolation layer allows for merging various devices in the same isolation pocket without use of area consuming sinker regions to contact the isolation layer from the surface. In an LDMOS device, the break-down voltage (BV) is typically supported laterally between the source and drain, but may also be limited by other design aspects. In certain example embodiments, aspects of the present disclosure involve a high-side capable LDMOS device in which the vertical junction breakdown between the isolation layer and the isolated well above it reduces as, or is not, a limiting factor as the application voltage increases.

In more specific example embodiments, aspects of the present disclosure include an LDMOS device that achieves high vertical break-down voltage (BV) using a lightly-doped isolation layer (LDIL). Doping in the isolation layer in accordance with various embodiments is light, which can typically be less than 1e17 cm-3. The doping level of the LDIL can cause the LDIL to be depleted by the surrounding layers of reverse polarity and supports a voltage drop between source and drain regions along the LDIL. The exact doping is determined by providing charge balance between alternating p- and n-type layers for mutual depletion. The doping can be optimized to also provide the required punch-through voltage and high-side BV.

In a number of embodiments, a LDMOS device includes a semiconductor substrate of a first conductivity type, active MOS regions, and a LDIL. The active MOS regions include a source region enclosed in a body region with a gate overlying part of the body region to form a MOS channel, and a drain region spaced apart from the source region. The drain region connects to the MOS channel via an extended drain region which may include a plurality of PN junctions for reduced surface field (RESURF) effect. In more specific embodiments, electrodes can be formed along or at a contact layer adjacent the source/drain regions. The LDIL is of a second conductivity type and is formed above and laterally along the semiconductor substrate. The LDIL is located between the semiconductor substrate and at least a part of the active MOS regions. As described above, the LDIL is doped with dopant of the second conductivity type to cause, in response to selected voltages applied to the LDMOS device (e.g., at the electrodes for the source/drain regions), the plurality of PN junctions, the LDIL, and the substrate to deplete each other and to support a voltage drop between the source and drain regions along the LDIL.

In specific embodiments, the doping of the LDIL can provide a charge balance between alternative junctions of opposite polarity among the PN junctions. The LDIL can have a doping of a similar magnitude as the overlying layers. More specifically, the LDIL is doped with a magnitude of dopant that is less than dopant used to dope the plurality of PN junctions and/or that is at most the same doping as used to dope the plurality of PN junctions. In various embodiments, the LDIL is doped with sufficient dopant of the second conductivity type to provide a particular punch-through and high-side BV. The high-side BV can be greater than the drain-source BV (BVdss) of the LDMOS device. In more-specific and related embodiments, the LDIL can include a plurality of regions, each of which has a different doping concentration.

A number of embodiments are directed to methods of forming LDMOS devices as described above. Forming the LDMOS device in accordance with various embodiments includes forming a semi-conductor substrate of a first conductivity type and forming active MOS regions including source and drain regions (e.g., adjacent a contact layer having source/drain electrodes) and including a plurality of PN junctions. The method further includes forming a LDIL of a second conductivity type above and laterally along the semiconductor substrate, and located between the semiconductor substrate and at least a part of the active MOS regions. The LDIL is doped with dopant of the second conductivity type to cause, in response to voltages being applied (e.g., at the electrodes), the plurality of PN junctions, the LDIL, and the substrate to deplete each other and to support a voltage drop between the source and drain regions along the LDIL.

In various embodiments, the LDMOS devices can provide an isolation scheme for high voltage. In such embodiments, the LDIL can be implanted and then a layer of epitaxial silicon is grown forming a buried LDIL. The thickness of the epitaxial layer determines the BV that can be supported vertically between the active MOS regions and the LDIL, which adds to the voltage that is being supported along the LDIL in the manner further described herein. In other embodiments, the LDMOS devices can provide an isolation scheme for a voltage that is lower than the high voltage. In such embodiments, the LDIL can be surface implanted to achieve the high vertical BV. The LDMOS devices used for relatively lower voltage may not (need to) include an epitaxial layer, which can reduce process complexity and cost associated with forming the devices.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
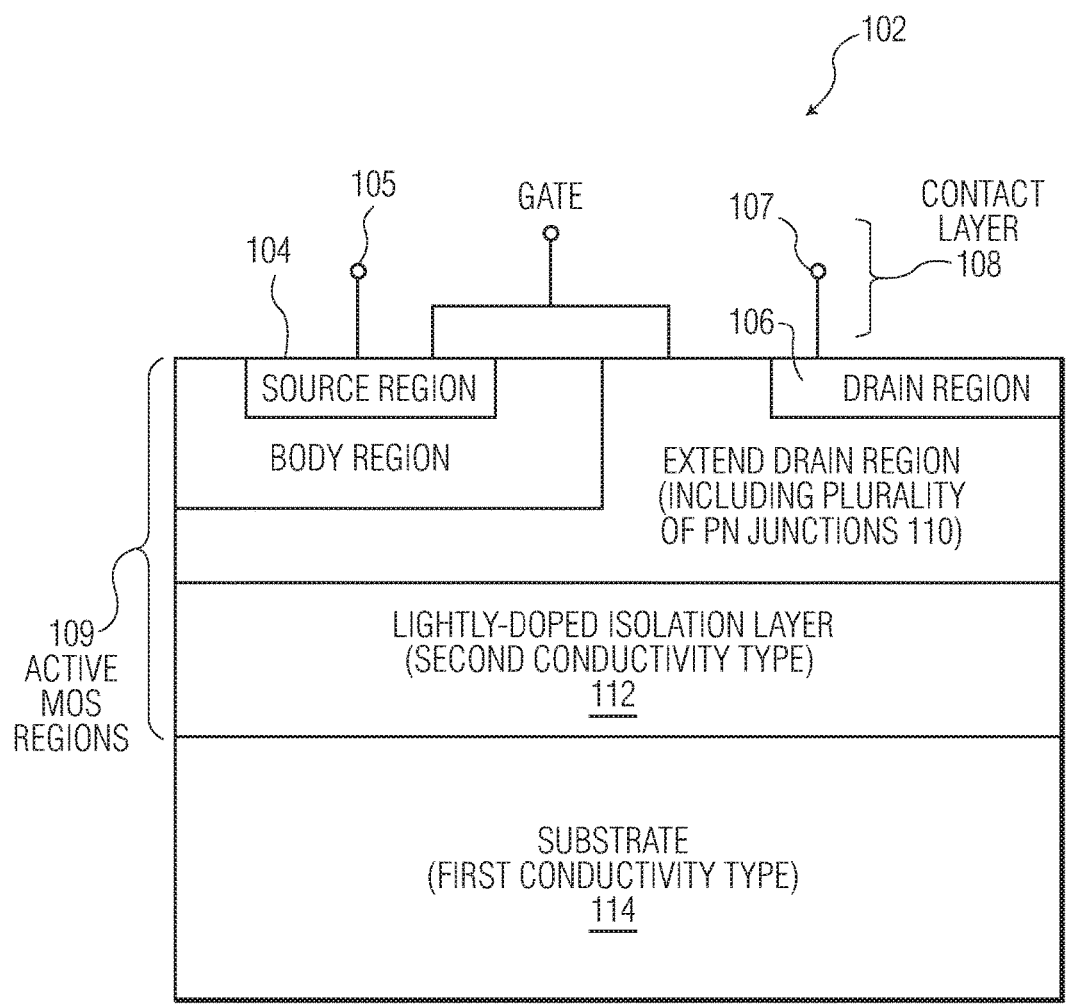
FIG. 1 illustrates an example of an LDMOS device, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of devices, systems and methods involving a laterally diffused metal oxide semiconducting (LDMOS) devices that include a lightly-doped isolation layer (LDIL). In certain implementations, aspects of the present disclosure have been shown to be beneficial when used in the context of an LDIL that is doped to cause depletion of surrounding areas and to support a voltage drop across the source and drain regions along the LDIL. In some embodiments, the voltage drop across the source and drain regions along the LDIL results in a high-side breakdown voltage, e.g., in a vertical direction, that is greater than the drain-source breakdown of the LDMOS device. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Figure 2:
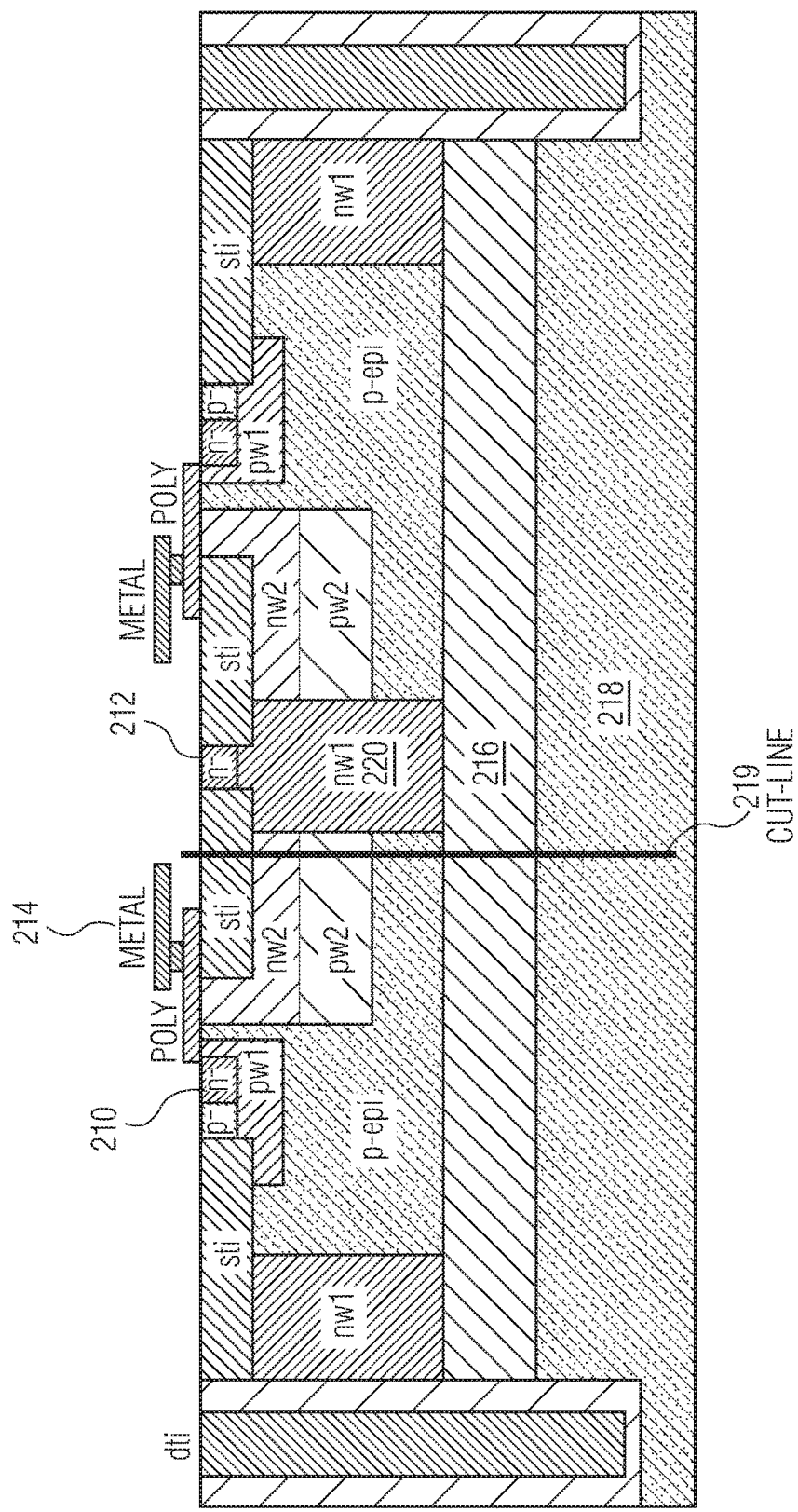
FIG. 2 illustrates an example of an nLDMOS device, in accordance with the present disclosure.
Figure 5:
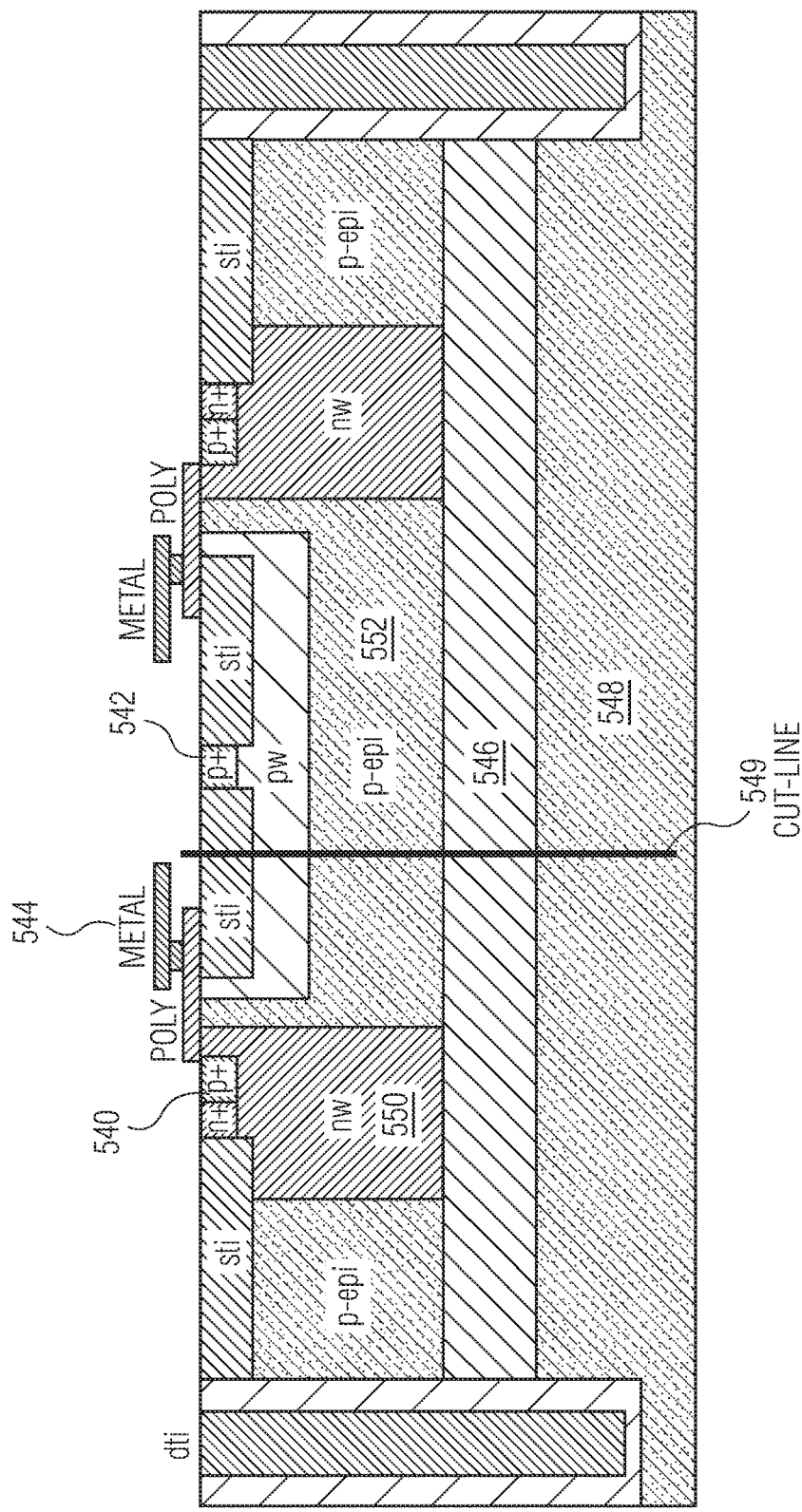
FIG. 5 illustrates an example of a pLDMOS device, in accordance with the present disclosure.

Various embodiments of the present disclosure are directed to LDMOS devices that have a LDIL used to provide high breakdown voltages (BVs). As previously described, various automotive, industrial, and consumer applications have increasing demands on Smart Power technologies which integrate digital, analog, and high-voltage power transistors in one chip. Various embodiments involve the integration of high voltage devices with high side capability onto an advanced CMOS platform in a manner that involves a robust and cost effective isolation scheme for the high voltage power devices. LDMOS devices can have a break-down that occurs in the drift region, the termination or vertically between the body and the isolation layer. For a given depth of the isolation layer, termination and drift region BV can be increased by layout adjustments. Vertical junction BV (e.g., vertically between the body (nLDMOS as illustrated by FIG. 2) or drain (pLDMOS as illustrated by FIG. 5) and the isolation layer) can be determined by the width of the depletion region that can form between the wells or the active MOS device and the isolation layer in response to an applied reverse voltage depending on the underlying doping profiles. Generally, the isolation layer can be buried or surface implanted depending on the desired voltage withstand capability. In conventional high-side capable LDMOS, that includes a buried isolation layer, the width of the lightly doped region that can be depleted and supports voltage vertically is given by the depth of the respective active MOS device well, the epi thickness grown after forming the isolation layer, and the implant energy of the isolation layer. In a conventional LDMOS that includes surface implantation of the isolation layer without an epi process, the width of the lightly doped region supporting voltage is determined by the implant depth of the isolation layer and depth of the respective well of the active MOS device. For such a conventional high-side capable LDMOS, the doping in the isolation layer typically is too high to be depleted and support voltage, such that an increase in vertical BV can require an increase in depth of the isolation layer to withstand additional voltage. Due to limitations of ion implantation for manufacturing processes, surface implanted isolation layers are difficult to form with projected ranges (much) larger than 2 um. Considering the spread of the isolation layer around the projected range, and the finite depth of the active MOS layers, the maximum drain-source BV (BVdss) of a typical high-side capable LDMOS device with heavily doped surface implanted isolation layer may be limited to about 30V. Since additional margin is needed for a drain-source voltage rating Vdsmax=30V to account for process variation, electrostatic discharge (ESD) design margin, etc., typically BVdss of greater than 40V, the added process complexity and cost of an epitaxial process can be used to form a 30V rated LDMOS according previous techniques and devices. Various embodiments (e.g., such the 30V LDMOS device illustrated by FIG. 12) overcome this limitation by employing a surface implanted LDIL without the use of an epitaxial process by supporting part of the voltage laterally along the LDIL to achieve a vertical BV of greater than 45V, and in other embodiments the LDIL is buried. The doping in the LDIL causes a plurality of surrounding layers (e.g., PN junctions) to deplete each other and to support a voltage drop between the source and drain regions along the LDIL. In specific embodiments, the doping in the LDIL is selected such that the LDIL is depleted by surrounding layers of opposite polarity and supports a voltage drop between the drain sinker and body well along a path, as further illustrated herein. Due to the need of contacting the isolation layer from the surface, the limitation in depth for ion implantation also limits the thickness of an epitaxial layer, e.g., it may be difficult to reach a buried isolation layer covered by more than 4 um epitaxy using current manufacturing techniques. In order to further increase the epi thickness, a double epitaxial process can be employed such that an additional sinker layer can be formed after the first epitaxy, followed by a second epitaxial growth. Connection to the buried layer can be facilitated via a surface implant aligned with the sinker implant formed after the first epitaxy. Since such a double epitaxial process adds complexity and cost, it can be beneficial to alleviate the vertical limitation by employing a LDIL. For example, considering the depth of active MOS device wells and up-diffusion of the buried isolation layer, the vertical BV for a typical LDMOS with 4 um epi thickness can be limited to about 80V depending on process details. In order to achieve a vertical BV of greater than 120V sufficient for a Vdsmax=90V rating in a conventional device, a double epitaxial process may have to be used. In contrast, specific LDMOS devices disclosed herein achieve a high BV (e.g., greater than 120V in some embodiments) using a LDIL to increase the vertical BV underneath the body using a single epitaxy, i.e. without the use of or need for a double epitaxial process and associated process complexity and cost. The doping in the LDIL causes a plurality of surrounding layers (e.g., PN junctions) to deplete each other and to support a voltage drop between the source and drain regions along the LDIL. In specific embodiments, the doping in the LDIL is selected such that the LDIL is depleted by surrounding layers of opposite polarity and supports a voltage drop between the drain sinker and body well along a path, as further illustrated herein.

The LDIL is doped to isolate the device from the bulk substrate and to provide high side capability. The LDIL can be buried or can be surface implanted, such as for lower voltage requirement LDMOS devices. The doping, which is relatively light compared to typical doping used for isolation, can allow for surrounding material of an opposite polarity to deplete the LDIL and to support a voltage drop along the LDIL between the source and drain regions. As a result, not all voltage is supported vertically between the body well and the LDIL. In various embodiments, a link region (which can also be referred to as a link implant) is disposed under source or drain regions to form an electrical connection between at least a portion of the active MOS regions, such as the source or drain, and the LDIL. For example, an n-type link region is disposed under the drain region of an nLDMOS device to provide electrical connection between the drain region and an n-type LDIL. An n-type link region is disposed under the source region of a pLDMOS to provide electrical connection between the source and the n-type LDIL. With such arrangements, as further described and illustrated herein, PN junctions mutually deplete one another to allow for a voltage drop along the LDIL, and alleviating the LDIL/body (e.g., for an nLDMOS) or LDIL/drain (e.g., for a pLDMOS) vertical junction BV limitations, which can be due to a relatively thin (or no) epitaxial layer. In specific embodiments, a field plates consisting of poly gate(s) and metal layer(s) can assist in distributing the electric potential along the drift region, which can further improve the BV of the LDMOS devices.

In a number of embodiments, a LDMOS device includes a semiconductor substrate of a first conductivity type, active MOS regions, and a LDIL. The active MOS regions include source and drain regions and includes a plurality of PN junctions. The LDIL is of a second conductivity type and is formed above and laterally along the semiconductor substrate. The LDIL is located between the semiconductor substrate and at least a part of the active MOS regions. As described above, the LDIL is doped with dopant of the second conductivity type to cause, in response to selected voltages applied to the device (e.g., to the source/drain regions), the plurality of PN junctions to deplete each other and to support a voltage drop between the source and drain regions along the LDIL.

In specific embodiments, the doping of the LDIL can provide a charge balance between alternative junctions of opposite polarity among the PN junctions. The LDIL can have a doping of a similar magnitude as the overlying layers. More specifically, the LDIL can be doped with a magnitude of dopant of the second conductivity type that is less than the dopant used to dope the plurality of PN junctions and/or that is at most the same the doping as used to dope the plurality of PN junctions. In various embodiments, the LDIL is doped with sufficient dopant of the second conductivity type to provide a particular punch-through and high-side BV. The high-side BV can be greater than the drain-source BV (BVdss) of the LDMOS device. As may be appreciated by one of ordinary skill, embodiments are not so limited. In various embodiments, such as when the LDIL is included in the isolation layer, the LDIL may not be doped with a magnitude of dopant of the second conductivity type that is less than the dopant used to dope the plurality of PN junctions and/or may not be (at most) the same the doping as used to dope the plurality of PN junctions. Further, the high-side BV may not be greater than the BVdss of the LDMOS device in accordance with a number of embodiments.

In various specific and related embodiments, the LDIL can include a plurality of regions. Each of the plurality of regions can have a different doping concentration. For example, it has been demonstrated that a LDMOS device having an LDIL added in the isolation region achieves high BVDSS, even with some BV drop occurring, as further defined herein.

A number of embodiments are directed to methods of forming LDMOS devices as described above. Forming the LDMOS device includes forming a semi-conductor substrate of a first conductivity type and forming active MOS regions including source and drain regions (e.g., adjacent a contact layer) and including a plurality of PN junctions. The method further includes forming a LDIL of a second conductivity type above and laterally along the semiconductor substrate, and located between the semiconductor substrate and at least a part of the active MOS regions. LDIL is doped with dopant of the second conductivity type to cause, in response to voltages applied to the device, the plurality of PN junctions to deplete each other and to support a voltage drop between the source and drain regions along the LDIL.

In various embodiments, the LDMOS devices can provide an isolation scheme for high voltage. In such embodiments, the LDIL can be implanted and then a layer of epitaxial silicon is grown. In other embodiments, the LDMOS devices can provide an isolation scheme for a voltage that is lower than the high voltage. In such embodiments, the LDIL can be surface implanted to achieve the high vertical BV. The LDMOS devices used for relatively lower voltage may not include an epitaxial layer, which can reduce process complexity and cost associated forming the devices.

Turning now to the figures, FIG. 1 illustrates an example of a LDMOS device in accordance with the present disclosure. The LDMOS device 102 includes a semiconductor substrate 114 of a first conductivity type, active MOS regions 109, and a LDIL 112 of a second conductivity type. As further illustrated herein, the LDMOS devices in accordance with the present disclosure can be nLDMOS devices and/or pLDMOS devices.

The active MOS regions 109, as would be appreciated by one of ordinary skill, include source and drain regions 104, 106. The source and drain regions 104, 106 can be adjacent a contact layer 108 at which electrodes are formed. The contact layer 108 includes terminals 105, 107 for applying voltages to the source and drain regions 104, 106. The active MOS regions 109 further includes a body region surrounding the source region 104, an extended drain region that may contain a plurality of PN junction 110 for RESURF effect, and a gate region overlying part of the body region and overlapping source 104 and extended drain to form the MOS channel.

As illustrated by FIG. 1, the LDIL 112 of the second conductivity type is formed above and laterally along the semiconductor substrate 114. The LDIL 112 is located between the semiconductor substrate 114 and at least a part of the active MOS regions 109. The LDIL 112 is doped with the dopant of the second conductivity type to cause, in response to selected voltages applied at the electrodes, the plurality of PN junctions 110 to deplete each other and to support a voltage drop between the source region 104 and the drain region 106 along the LDIL 112.

In various embodiments, the LDIL 112 is doped with the dopant of the second conductivity type to provide a charge balance between alternating junctions of the opposite polarity among the plurality of PN junctions 110 and/or to provide a particular punch-through and high-side BV. The high-side BV can be greater than the BVdss of the LDMOS device 102. More specifically, the PN junctions 110 can mutually deplete one another to allow for the voltage drop along the LDIL 112, and alleviating the vertical junction breakdown limitation (which may be due to body/LDIL or drain/LDIL) due to a relatively thin or no epitaxial layer. The LDIL 112 can have a doping that is a similar magnitude as the overlying layers. In some specific embodiments, the LDIL 112 is doped with a magnitude of dopant of the second conductivity type that is less than the doping used to dope the plurality of PN junctions 110. In other embodiments and/or in addition, the LDIL is doped with at most the same doping used to dope the plurality of PN junctions 110 (e.g., nw2 in FIG. 2). In some specific embodiments, the LDIL 112 can be doped with between 2e15 cm-3 and 1e17 cm-3 of dopant of the second conductivity type. In other specific embodiments, the LDIL 112 can be doped with between 2e15 cm-3 and 2e17 cm-3 of dopant of the second conductivity type. As previously described, embodiments in accordance with the present disclosure are not so limited to the above described doping ranges and/or relative amounts of doping.

Although not illustrated by FIG. 1, various embodiments include a link region of the second conductivity type. The link region, which can be referred to as a link implant, extends adjacent to the contact layer 108 and towards the LDIL 112. The link implant can electrically connect the source or drain regions 104, 106 to the LDIL 112. As further illustrated herein, an nLDMOS has an LDIL 112 that is electrically connected to the drain region 106. A pLDMOS has an LDIL 112 that is electrically connected to the source region 104.

In related embodiments, and as further illustrated herein, the LDMOS device 102 can include at least one region of epitaxy. For example, the epitaxy region can be of a first conductivity type and is located laterally along the active MOS regions 109 and between the LDIL 112 and the active MOS regions 109.

As would be appreciated and further illustrated herein, the LDMOS device 102 can include nLDMOS or pLDMOS, in various embodiments. Further, the first conductivity type can include a p-type and the second conductivity type can include an n-type. In various embodiments, although not illustrated by FIG. 1, the LDIL 112 can include a plurality of regions. As previously described, each of the plurality of regions can have a different doping concentration.

FIG. 2 illustrates an example of an nLDMOS device, in accordance with the present disclosure. As previously described, the nLDMOS device can achieve high BV (e.g., greater than or equal to 120V) using a LDIL 216 to increase the vertical BV underneath the body. The doping in the LDIL 216 can cause the LDIL 216 to be depleted by the surrounding p-type layers and support a voltage drop between the drain sinker and the body well along the path indicated by cut-line 219.

As illustrated, the nLDMOS device includes a semiconductor substrate 218 of a first conductivity type, active MOS regions including a source region 210 and a drain region 212, and a LDIL 216 of a second conductivity type. The source and drain regions 210, 212 can be adjacent a contact layer at which electrodes are formed. The active MOS regions further include a gate 214 located between the source region 210 and the drain region 212, and a plurality of PN junctions in the extended drain region (e.g., nw2, pw2).

As previously described, the LDIL 216 is doped with dopant of a second type to cause the plurality of PN junctions (e.g., nw2, pw2) to deplete each other and to support a voltage drop between the source and drain regions 210, 212 along the LDIL 216. Consequently, not all voltage is or has to be supported vertically between body well and LDIL 216. Further, various embodiments can be used to provide isolation management for multi-finger structures. For example, the nLDMOS device can include a plurality of drain regions. Each of the drain regions of the nLDMOS device connects to the LDIL 216. Since each drain connects to the LDIL, all gate fingers in a large device experience an equivalent potential distribution, which is used to provide isolation management for multi-finger structures.

One or more drain regions of the nLDMOS device connects to the LDIL 216 via a link implant. For example, a link implant 220 is disposed under the drain region 212 to form an electrical connection between the drain region 212 and the LDIL 216. With such an arrangement, the alternating p-n junctions (e.g., nw2, pw2, LDIL 216, substrate 218) along the vertical direction near the drain region 212 mutually deplete each other allowing some voltage drop along the LDIL 216 (e.g., as further illustrated by FIG. 4), alleviating the LDIL/body vertical junction breakdown limitation due to a relatively thin epitaxial layer. In addition, field plates consisting of poly gate(s) and metal layer(s) (e.g., gate 214) helps distribute the electric potential more evenly along the drift region, which further improves the BVs of the nLDMOS. Similar device concepts can be applied to the pLDMOS to achieve a desirable BV, as further illustrated herein.

In specific embodiments, the nLDMOS includes a 90V LDMOS formed using bulk technology with a single thin p-epitaxial process, which can reduce manufacturing complexity. These type of LDMOS device can employ the n-type LDIL 216 to isolate the devices from the semiconductor substrate 218. As further illustrated herein, a BV of near or above 130V with below a threshold (e.g., low) temperature sensitivity can be achieved using such LDMOS devices, as further illustrated by FIGS. 7A-7B. In addition, example nLDMOS devices and pLDMOS device can demonstrate a high-side capability of at least 130V. The specific drain-source on resistance (Rdson) extracted from drain current (Id)-gate voltage (Vg) curves (e.g., FIGS. 8A-9B) is 243 mΩ·mm² and 720 mΩ·mm² for nLDMOS and pLDMOS, respectively. Both nLDMOS and pLDMOS devices exhibit excellent direct current (DC) and transient safe operation areas (SOAs) (e.g., FIGS. 9A-10B). In a particular embodiment, the BV of an nLDMOS device under the highest gate bias is beyond 105V, which can be partially attributed to an n-type well implant implemented around the drain region.

Figure 12:
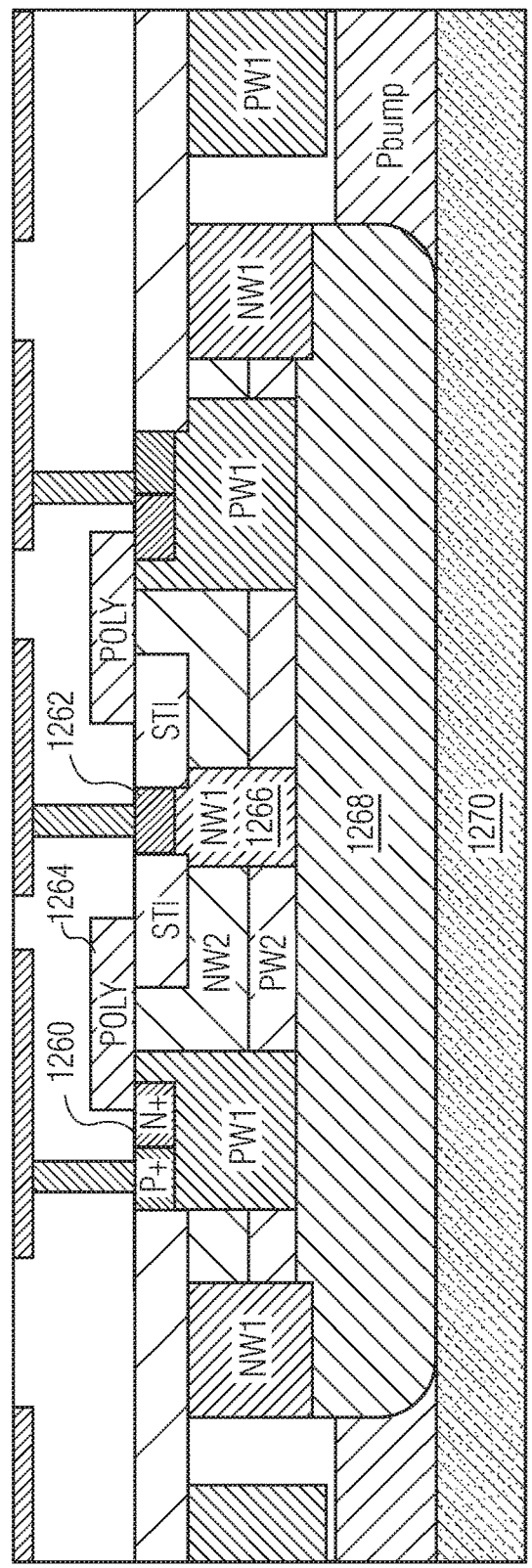
FIG. 12 illustrates an example of an nLDMOS device, in accordance with the present disclosure.

Example implant doping for an nLDMOS device rated for 90V, with a BVdss of 130V, as illustrated by FIG. 2, can include nw2 of around 5e12 cm-2 Phosphorus, pw2 of around 2e12 cm-2 Boron, LDIL of around 2.5e12 cm-2 Phosphorus. Example implant doping for an nLDMOS device rated for 30V, with a BVdss of 44V, as shown in FIG. 12 can include nw2 of around 7e12 cm-2 Phosphorus, pw2 of around 6e12 cm-2 Boron, LDIL of around 5e12 cm-2 Phosphorus. Although embodiments are not so limited and can include greater or less doping as suitable to optimize Rdson vs. BVdss for the targeted voltage.

Furthermore, embodiments are not limited to 90V LDMOS devices, and can be applied to and optimized for any voltage rating. In various embodiments, the LDMOS devices can have voltage rating of 30V. In such embodiments, the LDMOS device can be formed without the use of an epitaxial layer and which can reduce the process cost and complexity since a surface implanted isolation layer can be used with doping optimized to achieve the necessary vertical body-isolation BV. An example of such a device is illustrated by FIG. 12. Moreover, the LDIL based isolation scheme may be terminated using a deep trench (dti) as shown in FIGS. 2 and 5, or a junction isolation scheme as shown in FIG. 12.

Figure 3:
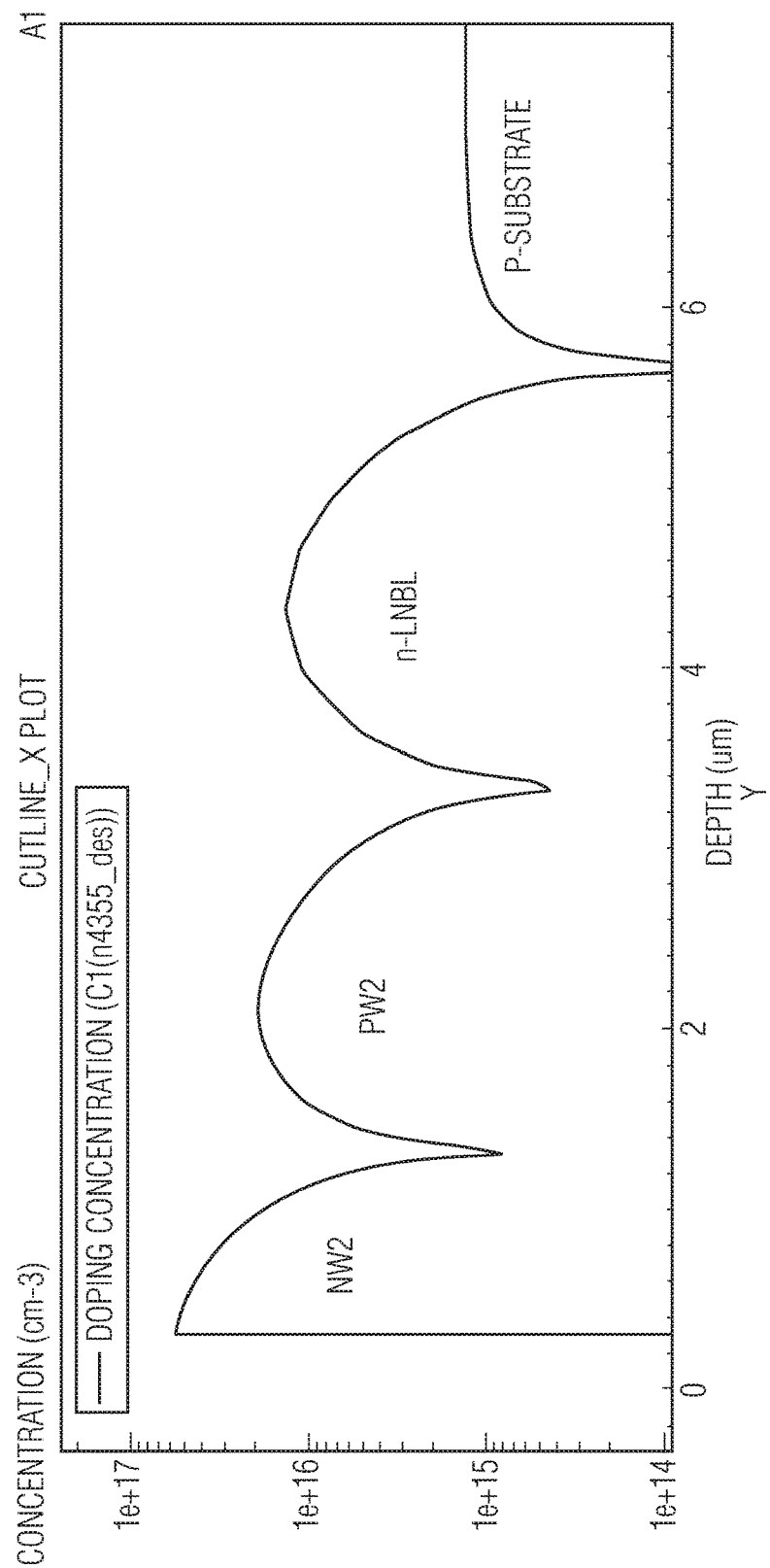
FIG. 3 illustrates example net-doping profile of an nLDMOS device, in accordance with the present disclosure.

FIG. 3 illustrates example net-doping profile of an nLDMOS device, in accordance with the present disclosure. The net-doping profile illustrated by FIG. 3 can be associated with the nLDMOS device illustrated by FIG. 2 in various embodiments. The net-doping profile illustrated by FIG. 3 can be along the cut-line 219 illustrated by FIG. 2.

Figure 4:
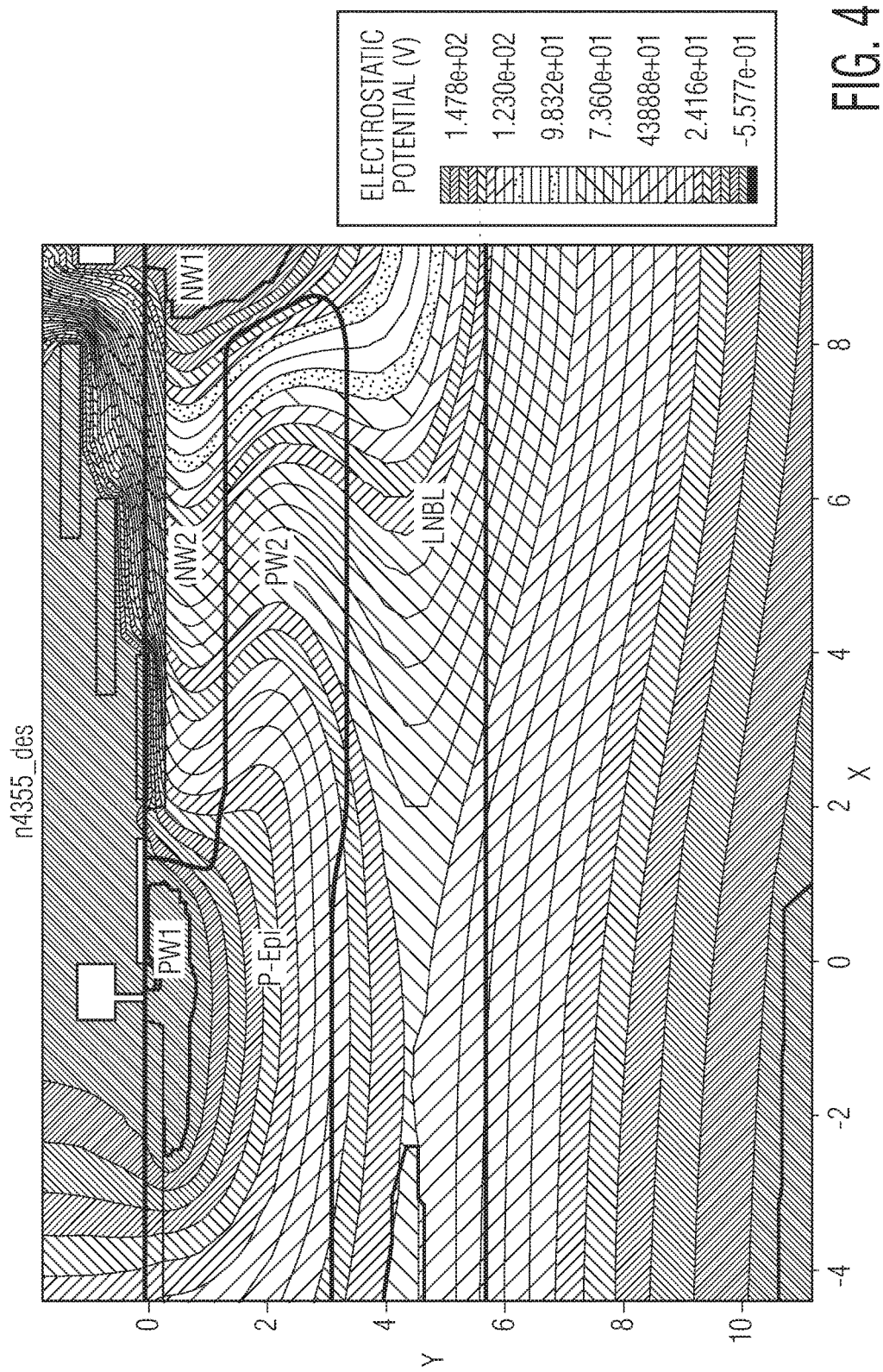
FIG. 4 illustrates an example electric potential distribution of an nLDMOS device, in accordance with the present disclosure.

FIG. 4 illustrates an example electric potential distribution of an nLDMOS device, in accordance with the present disclosure. The electric potential distribution illustrated by FIG. 4 can be associated with the nLDMOS device illustrated by FIG. 2 in various embodiments. More specifically, FIG. 4 illustrates the electric potential distribution and equipotential lines at break-down voltage for the 90V nLDMOS, contours indicate PN-junctions, light lines indicate the boundary of the depletion regions. Dropping voltage between source and drain along the LDIL layer (as indicated by the arrow) allows for a relaxed epi thickness requirement or increased vertical break-down for a given epi thickness.

As previously described, a number of embodiments can additionally or alternatively include a pLDMOS device. In such embodiments, the n-type LDIL can be electrically connected to the source region.

FIG. 5 illustrates an example of a pLDMOS device, in accordance with the present disclosure. Similarly to FIG. 2, the pLDMOS device can achieve high BV (e.g., greater than or equal to 120V) using a LDIL 546 to increase the vertical BV underneath the drain. The doping in the LDIL 546 can cause the LDIL 546 to be depleted by the surrounding p-type layers and support a voltage drop between the source sinker and the drain.

The pLDMOS device includes a semiconductor substrate 548 of a first conductivity type, active MOS regions including a source region 540 and a drain region 542, and the LDIL 546 of a second conductivity type. The source and drain regions 540, 542 are adjacent a contact layer at which electrodes are formed. The active MOS regions further includes a gate 544 located between the source region 540 and the drain region 542, and a plurality of PN junctions (e.g., pw, p-epi 552, LDIL 546, and the p-substrate 548).

The pLDMOS device can operate similarly to the previously described nLDMOS. For example, the LDIL 546 is doped with dopant of a second type to cause the plurality of PN junctions to deplete each other and to support a voltage drop between the source and drain regions 540, 542 along the LDIL 546. The LDIL 546 is depleted by the surrounding p-type layers (e.g., pw, p-epi 552, and p-substrate 548) and supports the voltage drop. Consequently, not all voltage is or has to be supported vertically between drain (pw) and LDIL 546. Further, various embodiments can be used to provide isolation management for multi-finger structures. For example, the pLDMOS device can include a plurality of source regions, and each source region 540 (and/or body) of the pLDMOS device connects to the LDIL 546. Since the LDIL 546 is connected to the source and/or body for each gate finger, all gate fingers in a large device experience an equivalent potential distribution.

One or more source regions of the pLDMOS device connects to the LDIL 546 via a link implant, as illustrated by the link implant 550 disposed under the source region 540 and that forms an electrical connection between the source region 540 and the LDIL 546. The alternating p-n junctions (pw, p-epi 552, LDIL 546, and p-substrate 548) along the vertical direction mutually deplete each other allowing some voltage drop along the LDIL 546 (e.g., as further illustrated by FIG. 6), alleviating the LDIL/drain (pw) vertical junction breakdown limitation due to a relatively thin epitaxial layer. In addition, field plates consisting of poly gate(s) and metal layer(s) (e.g., gate 544) helps distribute the electric potential more evenly along the drift region, as previously described in connection with FIG. 2.

Figure 6:
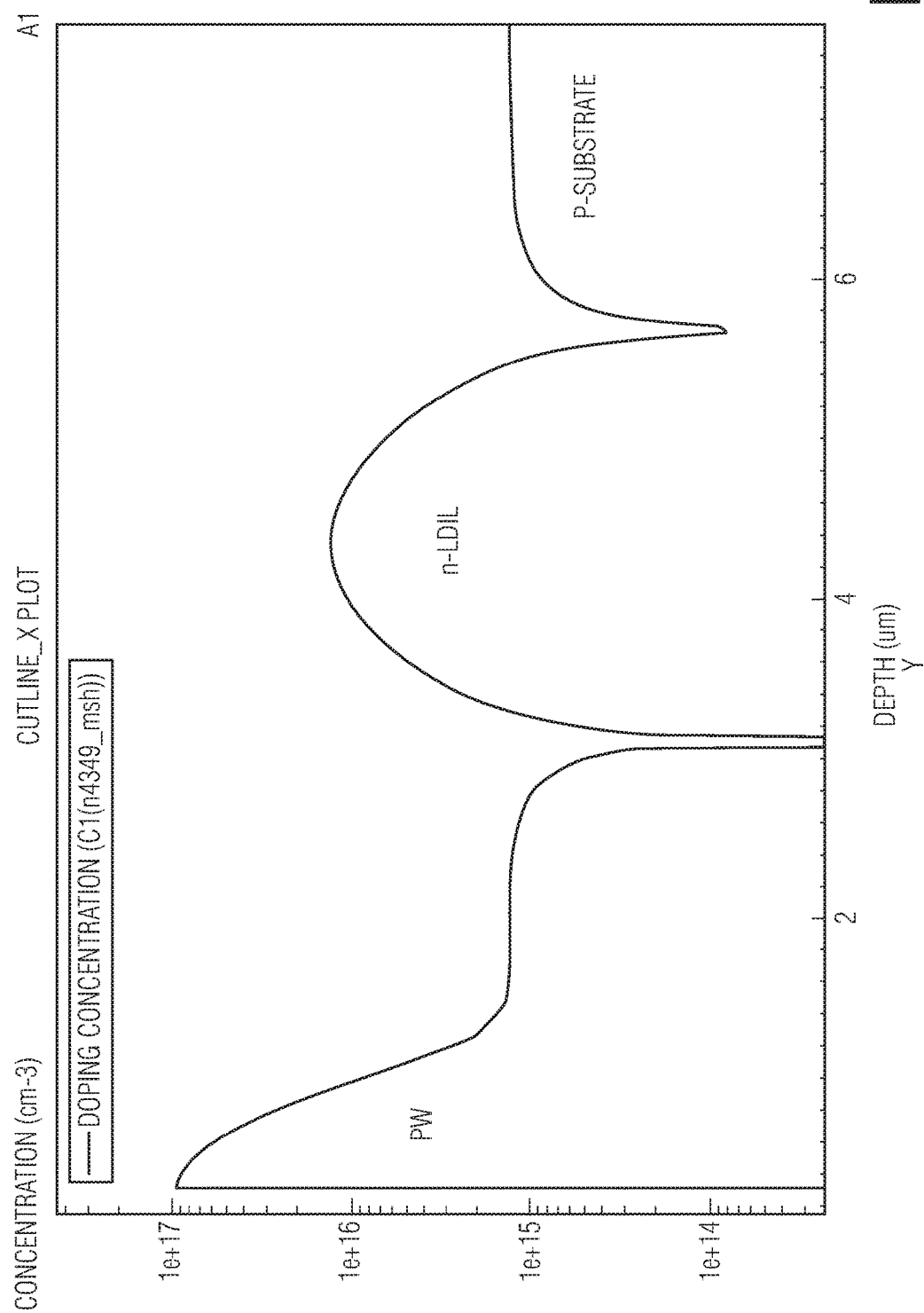
FIG. 6 illustrates an example net-doping profile of a pLDMOS device, in accordance with the present disclosure.

FIG. 6 illustrates example net-doping profile of a pLDMOS device, in accordance with the present disclosure. The net-doping profile illustrated by FIG. 6 can be associated with the pLDMOS device illustrated by FIG. 5 in various embodiments. The net-doping profile illustrated by FIG. 6 can be along the cut-line 549 illustrated by FIG. 5.

Figure 7A:
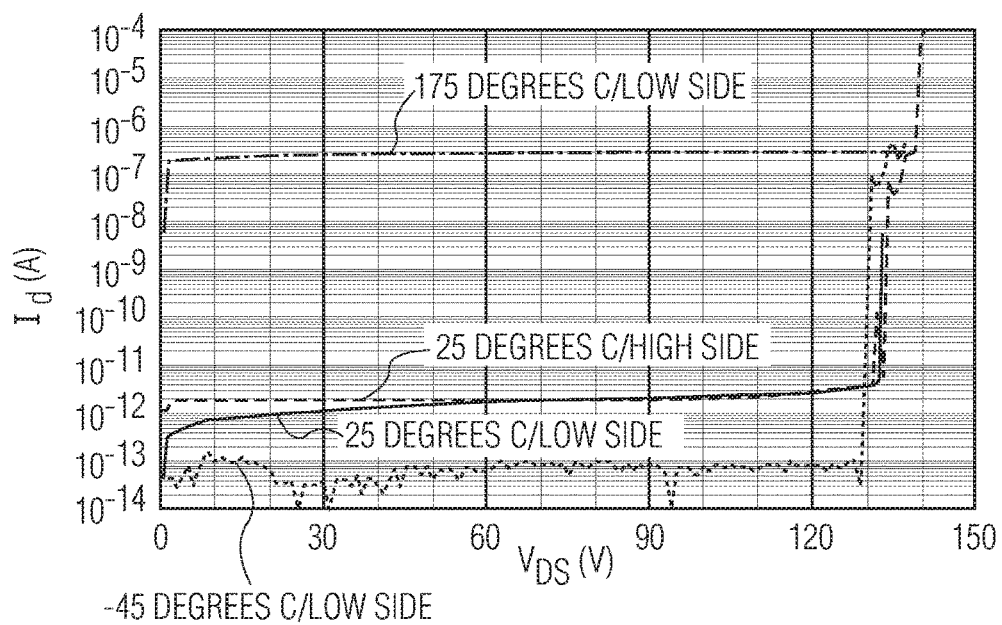
FIGS. 7A-7B illustrate example off state current-voltage plots for LDMOS devices, in accordance with the present disclosure.
Figure 7B:
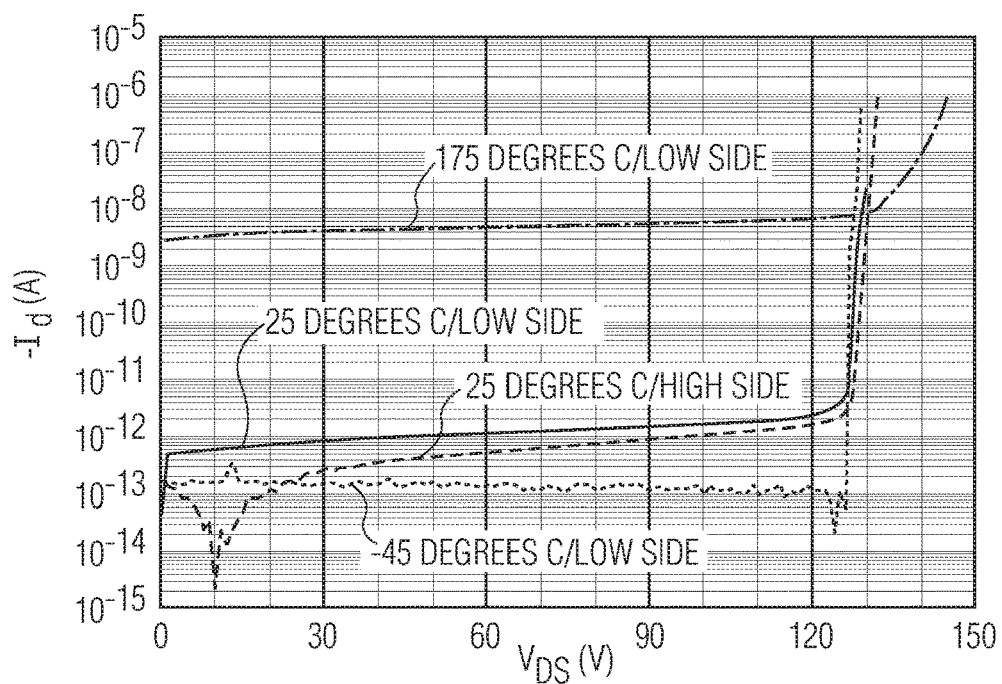

FIGS. 7A-7B illustrate example off state current (I)-voltage (V) plots for LDMOS devices, in accordance with the present disclosure. For example, the off state I-V plot illustrated by FIG. 7A can be associated with the nLDMOS device illustrated by FIG. 2 and the off state I-V plot illustrated by FIG. 7B can be associated with the pLDMOS device illustrated by FIG. 5, although embodiments are not so limited. As illustrated, both example LDMOS devices show a high-side capability of at least 130V and a BV of near or above 130V.

Figure 8A:
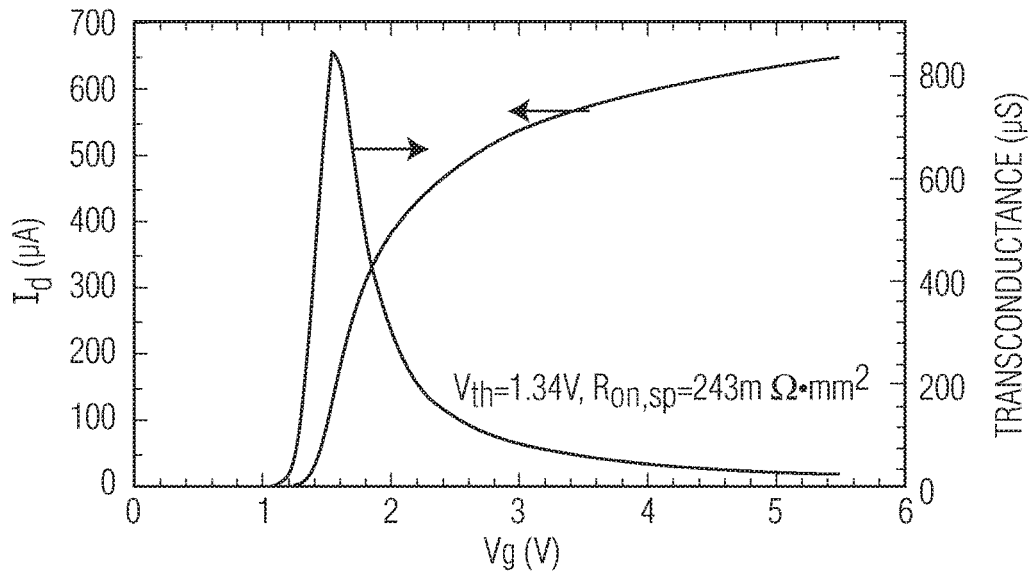
FIGS. 8A-8B illustrate example drain current-gate voltage curve for LDMOS devices, in accordance with the present disclosure.
Figure 8B:
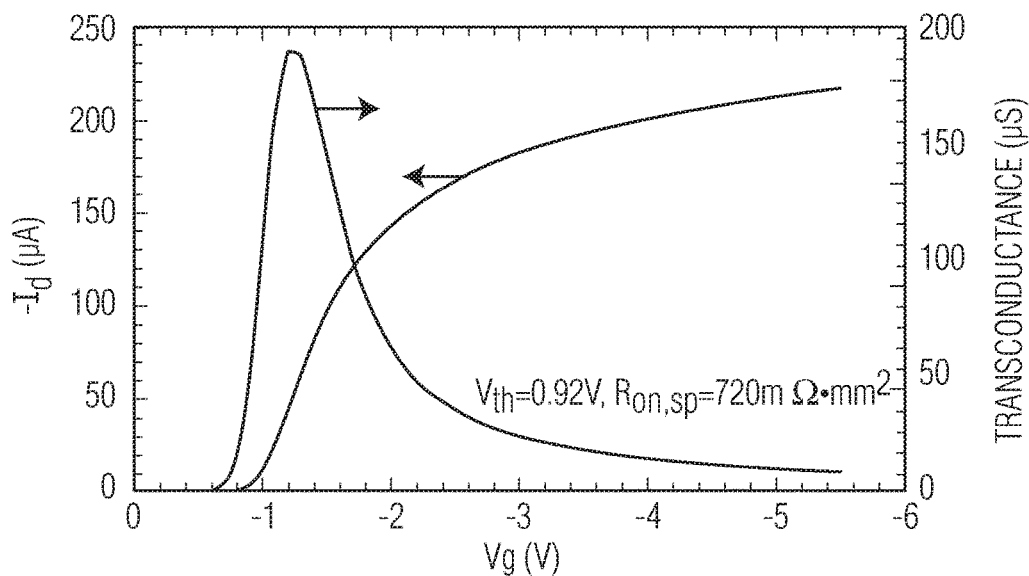

FIGS. 8A-8B illustrate example Id-Vg curve for LDMOS devices, in accordance with the present disclosure. The Id-Vg curve illustrated by FIG. 8A can be associated with the nLDMOS device illustrated by FIG. 2 and the Id-Vg curve illustrated by FIG. 8B can be associated with the pLDMOS device illustrated by FIG. 5, although embodiments are not so limited. The specific Rdson extracted from Id-Vg curves is 243 mΩ·mm² and 720 mΩ·mm² for nLDMOS and pLDMOS, respectively.

Figure 9A:
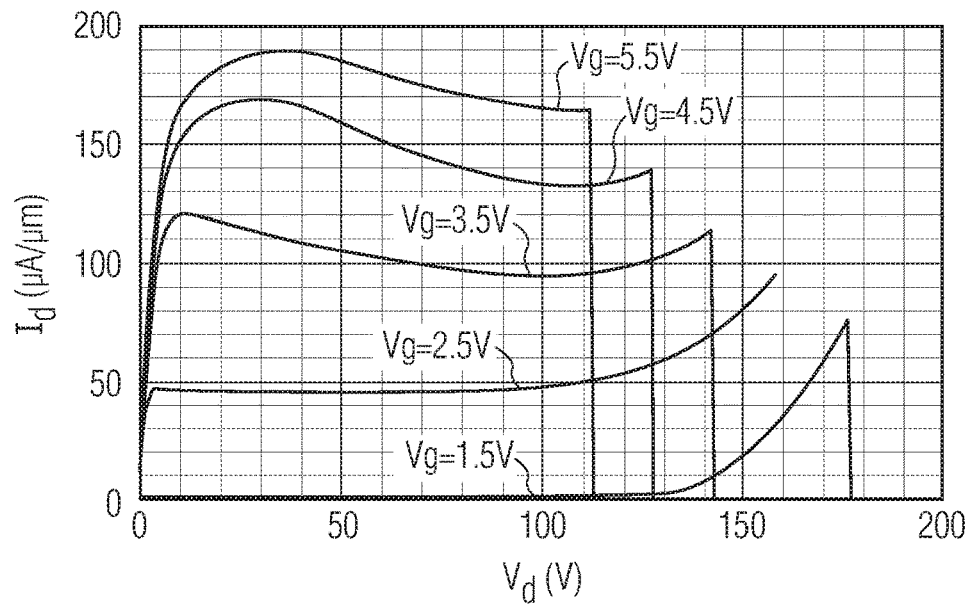
FIGS. 9A-9B illustrate example direct current safe operating areas for LDMOS devices, in accordance with the present disclosure.
Figure 9B:
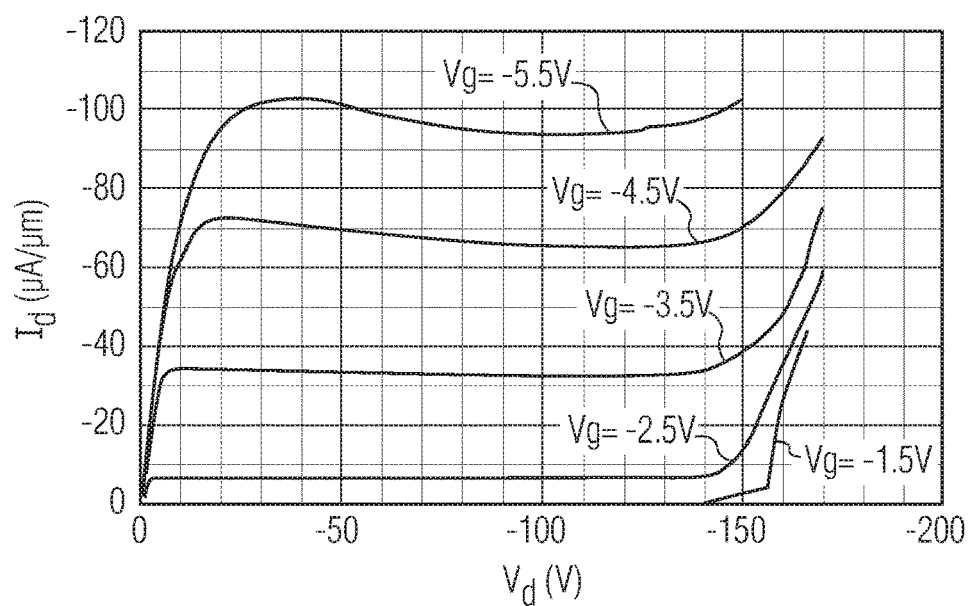

FIGS. 9A-9B illustrate example DC SOAs for LDMOS devices, in accordance with the present disclosure. The DC SOA illustrated by FIG. 9A can be associated with the nLDMOS device illustrated by FIG. 2 and the DC SOA illustrated by FIG. 9B can be associated with the pLDMOS device illustrated by FIG. 5, although embodiments are not so limited.

Figure 10A:
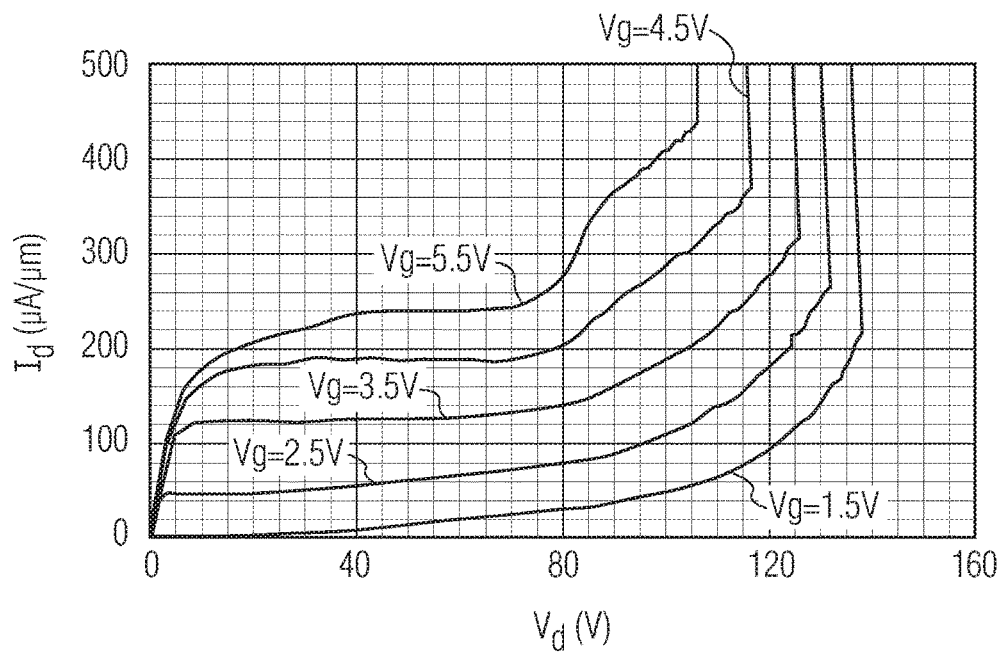
FIGS. 10A-10B illustrate example transmission line pulse safe operating areas for LDMOS devices, in accordance with the present disclosure.
Figure 10B:
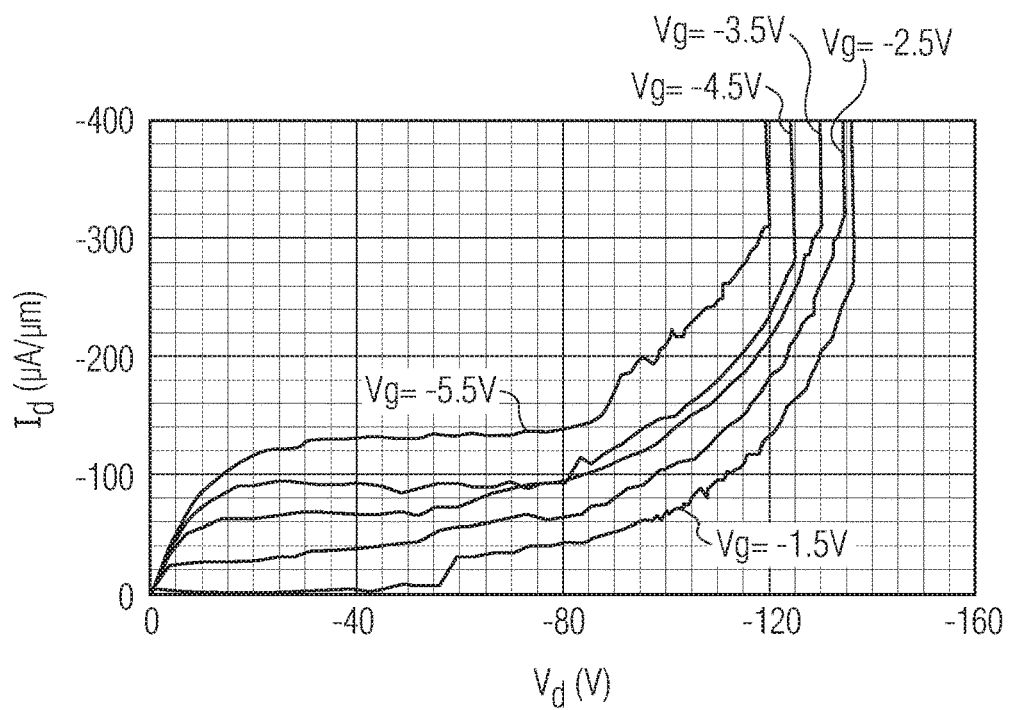

FIGS. 10A-10B illustrate example transmission line pulses (TLP) SOAs for LDMOS devices, in accordance with the present disclosure. The TLP SOA illustrated by FIG. 10A can be associated with the nLDMOS device illustrated by FIG. 2 and the TLP SOA illustrated by FIG. 10B can be associated with the pLDMOS device illustrated by FIG. 5, although embodiments are not so limited.

Figure 11:
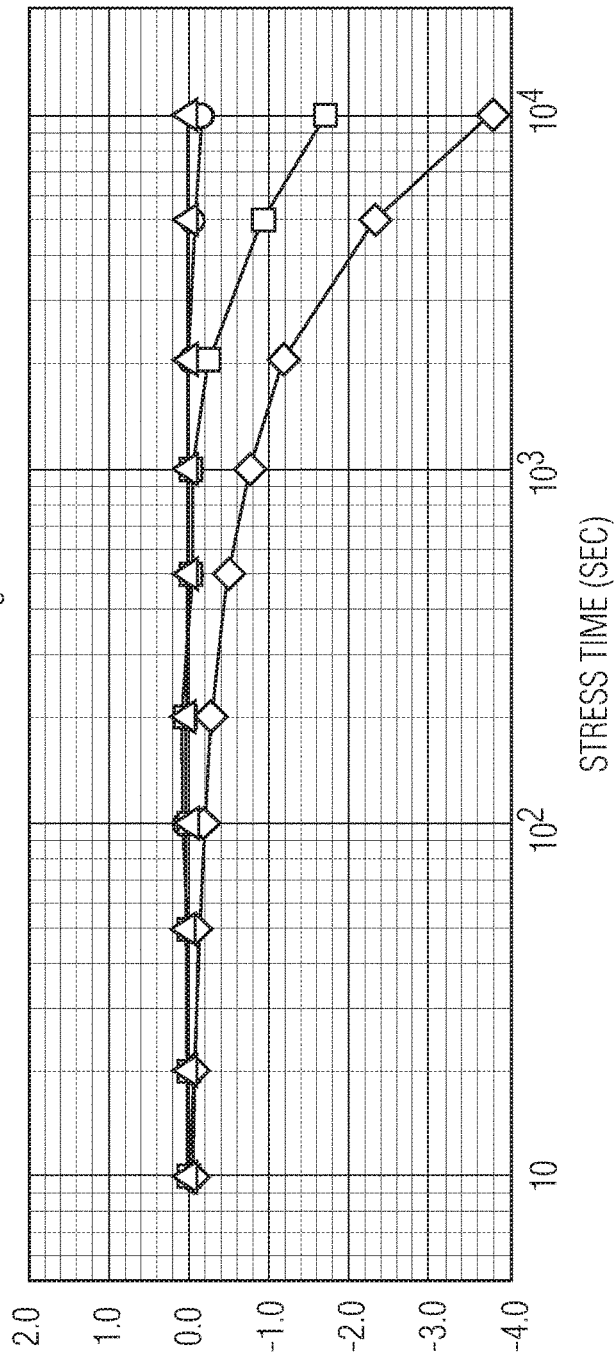
FIG. 11 illustrates a degradation of an example LDMOS device under a stress test, in accordance with the present disclosure.

FIG. 11 illustrates a degradation of an example LDMOS device under a stress test, in accordance with the present disclosure. In certain battery management applications, the nLDMOS device can potentially be exposed to a bias as high as 112V during transient operation. To mimic such an operation condition, a stress test can be conducted with a drain voltage (Vd) of 112V and a Vg of 2V up to 10,000 seconds. FIG. 11 shows the nLDMOS device is robust against such a stress test. Moreover, the nLDMOS shows a degradation of less than four percent in all examined key device parameters after 10,000 second stress. In specific embodiments, the nLDMOS device used in the stress test can include the nLDMOS device illustrated by FIG. 2.

FIG. 12 illustrates an example of an nLDMOS device, in accordance with the present disclosure. More specifically, FIG. 12 illustrates an example nLDMOS in a 30V junction isolated technology. Layers nw2, pw2, and n-type LDIL are processed as a chain implant from the surface without the use of an epitaxy, in accordance with various embodiments. Such a device, in experimental embodiments, can be shown to achieve Rdson=22 mΩ·mm² with a BV of 44V. The corresponding pLDMOS built in a 30V junction isolated technology can achieve yielding Rdson=48 mΩ·mm² and a BV of 44V.

Similarly to FIG. 2, the nLDMOS device illustrated by FIG. 12 includes a semiconductor substrate 1270 of a first conductivity type, active MOS regions including a source region 1260 and a drain region 1262, and a LDIL 1268 of a second conductivity type. The source and drain regions 1260, 1262 are adjacent a contact layer at which electrodes are formed. The active MOS regions further includes a gate 1264 located between the source region 1260 and the drain region 1262, and a plurality of PN junctions (e.g., nw2, pw2).

The LDIL 1268 is doped with dopant of a second type to cause the plurality of PN junctions (e.g., nw2, pw2) to deplete each other and to support a voltage drop between the source and drain regions 1260, 1262 along the LDIL 1268. In various embodiments, each drain region of the nLDMOS device connects to the LDIL 1268. Since every drain connects to the LDIL 1268, all gate fingers in a large device experience an equivalent potential distribution.

One or more drain regions of the nLDMOS device connects to the LDIL 1268 via a link implant, such as illustrated by the link implant 1266 disposed under the drain region 1262 that forms an electrical connection between the drain region 1262 and the LDIL 1268. The alternating p-n junctions (e.g., nw2, pw2) along the vertical direction near the drain region 1262 mutually deplete each other allowing a voltage drop along the LDIL 1268, and alleviating the LDIL/body (pw1) vertical junction breakdown limitation allowing for processing the LDIL as a surface implant without the use of (or need for) epitaxy. In addition, field plates consisting of poly gate(s) and metal layer(s) (e.g., gate 1264) helps distribute the electric potential more evenly along the drift region, which further improves the breakdown voltages of the nLDMOS. Similar device concepts can be applied to the pLDMOS to achieve a desirable breakdown voltage that is lower than the device illustrated by FIG. 5.

The devices and/or systems illustrated herein can be used to implement a variety of methods. An example method of forming or manufacturing a LDMOS device, in accordance with various embodiments includes forming a semiconductor substrate of a first conductivity type and forming active MOS regions including source and drain regions which can be adjacent a contact layer and including a plurality of PN junctions. The method further includes forming a LDIL of a second conductivity type above and laterally along the semiconductor substrate, and located between the semiconductor substrate and at least a part of the active MOS regions. The LDIL being doped with dopant of the second conductivity type to cause, in response to selected voltages applied to the device, the plurality of PN junctions to deplete each other and to support a voltage drop between the source and drain regions along the LDIL. In some specific embodiments, forming the LDIL layer includes implanting the LDIL and then growing an epitaxial layer (e.g., the LDIL is buried). In other embodiments, forming the LDIL includes surface implanting the LDIL, and which may not be followed by growing the epitaxial layer. Further, as would be appreciated by one of ordinary skill, the method can further include doping various regions and substrates, such as doping the LDIL with the dopant of the second conductivity type.

Doping in the LDIL in accordance with various embodiments is light, which can typically be less than 1e17 cm-3, such that the LDIL can be depleted by the surrounding p-type layers and support a voltage drop between source and drain along the LDIL. The exact doping is determined by providing charge balance between the alternating p- and n-type layers for mutual depletion (see doping profiles in FIG. 3 and FIG. 6). The doping is optimized to also provide the required punch-through voltage and high side BV. In contrast, typical nLDMOS and pLDMOS implementations use a heavily doped buried layer for isolation, but show a fairly similar cross-section if one disregards the doping level. Heavy doping, typically greater than 1e18 cm-3, can decrease parasitic substrate PNP gain, improve ESD robustness, increase punch-through voltage, and minimize voltage drop over large distances as present in large isolation pockets shared by multiple devices. For a typical nLDMOS formed over such a heavily doped buried layer, the potential underneath the body is given by the applied voltage, which is typically either the drain or supply voltage, and no significant voltage drop may occur. In order to increase BV, the typical approach is increase the total epi thickness, which may necessitate the complexity and cost of a two-step epi process. Embodiments in accordance with the present disclosure include the use of a LDIL to provide high BV without increasing the epi thickness. A similar consideration applies to the pLDMOS for the potential between drain and LDIL.

Various embodiments are implemented in accordance with the underlying Provisional Application (Ser. No. 62/472,291), entitled "Novel 90V LDMOS in a 9 nm SmartMOS™ Technology", filed Nov. 29, 2016 to which benefit is claimed and is fully incorporated herein by reference. For instance, embodiments herein and/or in the provisional application may be combined in varying degrees (including wholly), such as the device illustrated by FIG. 1 and/or FIG. 2 of the underlying Provisional application. For information regarding details of these and other embodiments, applications and experiments (as combinable in varying degrees with the teachings herein), reference may be made to the teachings and underlying references provided in the Provisional Application which forms part of this patent document and is fully incorporated herein. Accordingly, the present disclosure is related to methods, applications and devices in and stemming from the disclosures in the Provisional Application (including the references and illustrations therein), and also to the uses and development of devices and processes discussed in connection with the references cited herein.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, nodes and/or other circuit-type depictions (e.g., reference numerals 102 of FIG. 1 and as illustrated by FIG. 2 and FIG. 5) depict a circuit as described herein. Such circuits or circuitry are used together with other elements to exemplify how certain embodiments may be carried out in the form of structures, steps, functions, operations, activities, etc. For example, in certain of the above-discussed embodiments, one or more modules are discrete logic circuits or programmable logic circuits configured and arranged for implementing these operations/activities. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified throughout the describes may involve steps carried out in various orders, with one or more aspects of the embodiments herein retained, or may involve fewer or more steps, and which can be used to form various devices illustrated herein. For instance, the devices illustrated by FIG. 2 and FIG. 5 can be formed via the methods described herein. As another example, the devices formed can include the device illustrated by FIG. 12. Such modifications do not depart from the true spirit and scope of various aspects of the disclosure, including aspects set forth in the claims.

What is claimed is:

1. A laterally diffused metal oxide semiconducting (LDMOS) device, comprising:
    a semiconductor substrate of a first conductivity type;
    active MOS regions including source and drain regions and including a plurality of PN junctions in a region extending from a region adjacent one of the source and drain regions and towards the semiconductor substrate;
    a lightly-doped isolation layer of a second conductivity type formed above and laterally along the semiconductor substrate, and located between the semiconductor substrate and at least a part of the active MOS regions, the lightly-doped isolation layer being doped with dopant of the second conductivity type to cause, in response to selected voltages applied to the LDMOS device, the plurality of PN junctions to deplete each other and to support a voltage drop between the source and drain regions along the lightly-doped isolation layer; and
    wherein the lightly-doped isolation layer is doped with a magnitude of dopant of the second conductivity type that is less than doping used to dope the plurality of PN junctions.

2. The LDMOS device of claim 1, wherein the lightly-doped isolation layer is doped with the dopant of the second conductivity type to provide a charge balance between alternating junctions of opposite polarity among the plurality of PN junctions.

3. The LDMOS device of claim 1, wherein the lightly-doped isolation layer is doped with a sufficient dopant of the second conductivity type to provide a particular punch-through and high-side breakdown voltage.

4. The LDMOS device of claim 3, wherein the high-side breakdown is greater than the drain-source breakdown (BVdss) of the LDMOS device.

5. The LDMOS device of claim 1, wherein the lightly-doped isolation layer is doped with the dopant of the second conductivity type to provide a charge balance between alternating junctions of opposite polarity among the plurality of PN junctions and to account for a punch-through voltage and a high-side breakdown voltage.

6. The LDMOS device of claim 1, further including a link region of the second conductivity type configured and arranged to electrically connect a portion of the active MOS regions to the lightly-doped isolation layer and to extend adjacent to a contact layer and extend toward the lightly-doped isolation layer.

7. The LDMOS device of claim 1, wherein the first conductivity type is a P-type and the second conductivity is an N-type or wherein the first conductivity type is an N-type and the second conductivity is a P-type.

8. The LDMOS device of claim 1, further including at least one region of epi of a first conductivity type located laterally along the active MOS regions, and located between the lightly-doped isolation layer and the active MOS regions.

9. The LDMOS device of claim 1, wherein the lightly-doped isolation layer is doped with between 2e15 cm-3 and 1e17 cm-3 of dopant of the second conductivity type.

10. The LDMOS device of claim 1, wherein the lightly-doped isolation layer is doped with between 2e15 cm-3 and 2e17 cm-3 of dopant of the second conductivity type.

11. The LDMOS device of claim 1, wherein the lightly-doped isolation layer is electrically connected to the source region, and further including a contact layer at which electrodes are located for connection to the source and drain regions.

12. The LDMOS device of claim 1, wherein the lightly-doped isolation layer is electrically connected to the drain region.

13. The LDMOS device of claim 1, wherein the lightly-doped isolation layer includes a plurality of regions.

14. The LDMOS device of claim 13, wherein the plurality of regions have different doping concentrations.

15. A laterally diffused metal oxide semiconducting (LDMOS) device, comprising:
 a semiconductor substrate of a first conductivity type;
 active MOS regions including source and drain regions and including a plurality of PN junctions; and
 a lightly-doped isolation layer of a second conductivity type formed above and laterally along the semiconductor substrate, and located between the semiconductor substrate and at least a part of the active MOS regions, the lightly-doped isolation layer being doped with dopant of the second conductivity type to cause, in response to selected voltages applied to the LDMOS device, the plurality of PN junctions to deplete each other and to support a voltage drop between the source and drain regions along the lightly-doped isolation layer, wherein the lightly-doped isolation layer is doped with at most the same doping used to dope the plurality of PN junctions.

16. A method of forming a laterally diffused metal oxide semiconducting (LDMOS) device, comprising:
 forming a semiconductor substrate of a first conductivity type;
 forming active MOS regions including source and drain regions and including a plurality of PN junctions in a region extending from a region adjacent one of the source and drain regions and towards the semiconductor substrate;
 forming a lightly-doped isolation layer of a second conductivity type above and laterally along the semiconductor substrate, and located between the semiconductor substrate and at least a part of the active MOS regions, the lightly-doped isolation layer being doped with dopant of the second conductivity type to cause, in response to selected voltages applied to the LDMOS device, the plurality of PN junctions to deplete each other and to support a voltage drop between the source and drain regions along the lightly-doped isolation layer; and
 wherein the lightly-doped isolation layer is doped with a magnitude of dopant of the second conductivity type that is less than doping used to dope the plurality of PN junctions.

17. The method of claim 16, wherein forming the lightly-doped isolation layer includes implanting the lightly-doped isolation layer and then growing an epitaxial layer.

18. The method of claim 16, wherein forming the lightly-doped isolation layer includes surface implanting the lightly-doped isolation layer.

19. The method of claim 16, further including doping the lightly-doped isolation layer with dopant of the second conductivity type sufficient to provide a particular punch-through and high-side breakdown voltage, wherein the high-side breakdown is greater than the drain-source breakdown (BVdss) of the LDMOS device.

* * * * *